United States Patent
Akiyama et al.

[19]

[11] Patent Number: 6,163,040
[45] Date of Patent: *Dec. 19, 2000

[54] THYRISTOR MANUFACTURING METHOD AND THYRISTOR

[75] Inventors: Hajime Akiyama; Kenichi Honda, both of Tokyo; Yousuke Morita, Gunma; Masahito Yoshikawa, Gunma; Takeshi Ohshima, Gunma, all of Japan

[73] Assignees: Mitsubishi Denki Kabushiki Kaisha; Japan Atomic Energy Reserch Institute, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/818,886

[22] Filed: Mar. 17, 1997

[30] Foreign Application Priority Data

Mar. 18, 1996 [JP] Japan ................................. 8-061364

[51] Int. Cl.$^7$ ........................ H01L 29/74; H01L 29/30
[52] U.S. Cl. .................... 257/131; 257/130; 257/119; 257/617
[58] Field of Search .................... 257/107, 119–121, 257/156, 129–131, 617

[56] References Cited

U.S. PATENT DOCUMENTS

| | | |
|---|---|---|
| 4,056,408 | 11/1977 | Bartko et al. . |
| 4,752,818 | 6/1988 | Kushida et al. ........................ 257/156 |
| 5,023,696 | 6/1991 | Ogino ..................................... 257/156 |
| 5,160,958 | 11/1992 | Akiyama . |
| 5,182,626 | 1/1993 | Akiyama et al. . |
| 5,292,672 | 3/1994 | Akiyama et al. . |
| 5,420,045 | 5/1995 | Schulze et al. ......................... 257/173 |
| 5,510,274 | 4/1996 | Minato .................................... 438/139 |
| 5,808,352 | 9/1998 | Sakamoto ............................... 257/156 |
| 5,981,981 | 11/1999 | Takahashi ............................... 257/133 |

FOREIGN PATENT DOCUMENTS

| | | |
|---|---|---|
| 0 297 325 | 1/1989 | European Pat. Off. . |
| 31 17 202 | 11/1982 | Germany . |
| 42 23 914 | 1/1994 | Germany . |
| 3-245569 | 11/1991 | Japan . |
| WO 92/17907 | 10/1992 | WIPO . |

OTHER PUBLICATIONS

W.R. Fahrner, J.R., et al., Nuclear Instruments and Methods in Physics Research, vol. A268, No. 2/3, pp. 579–588, "Application of High Energy Implantation in Semiconductors," May 20, 1988.

Proceedings of 1995 International Symposium on Power Semiconductor Devices & ICs, pp. 84–88, 1995, T. Nakagawa, et al., "A New High Power Low Toss GTO".

IEEE Transactions on Nuclear Science, vol. 42, No. 3, pp. 163–166, Jun. 1995, M. Kurokawa, et al., "Radiation Damage Factor for Ion–Implanted Silicon Detectors Irradiated with Heavy Ions".

Proceedings of 1988 International Symposium on Power Semiconductor Devices, pp. 147–152, 1988, W, Wondrak, et al., "Proton Implantation for Silicon Power Devices".

Proceedings of the 1990 International Symposium on Power Semiconductor Devices & ICs, pp. 231–235, 1990, Y. Shimizu, et al., "Application of a Proton Irradiation Technique to High Voltage Thyristors".

*Primary Examiner*—Steven Loke
*Assistant Examiner*—Ori Nadav
*Attorney, Agent, or Firm*—Oblon, Spivak, McClelland, Maier & Neustadt, P.C.

[57] ABSTRACT

A thyris a thyristor is provided in which a lifetime of a minority carrier is controlled to improve the trade-off relationship between an ON-state voltage and a turn-off time and attain a high frequency and a low loss. Shielding members formed of metal plates are provided respectively in spaces above a plane on which a cathode electrode is provided and a plane on which an anode electrode is provided.

4 Claims, 13 Drawing Sheets

THYRISTOR MANUFACTURING METHOD AND THYRISTOR

BACKGROUND OF THE INVENTION

1. Field of the Invention

The present invention relates to a method for manufacturing a thyristor and a thyristor, and more particularly to a method for manufacturing a thyristor in which a lifetime of a minority carrier is controlled to increase a frequency and reduce a loss, and a thyristor formed by the same method.

2. Description of the Background Art

In recent years, withstand voltages and currents of a thyristor and a diode have been increased. By taking the thyristor as an example, a device having a standard in which a withstand voltage is 10 kV and an ON-state current is several hundreds A during the operation of the thyristor has been developed. In the thyristor, generally, it is a goal of development to increase a switching speed of ON-OFF control action, that is, a so-called frequency characteristic. In the thyristor, a time for performing turn-off (a turn-off time) is shortened so that the frequency characteristic can be increased. If the turn-off time is shortened, the resistance of a thyristor element is increased. Consequently, an ON-state voltage is increased during operation. Thus, the thyristor has the trade-off relationship.

When the ON-state voltage is increased, an energy loss is increased so that a calorific value is increased. For this reason, an increase in the calorific value caused by the energy loss cannot be ignored in the thyristor having the high withstand voltage and current. If the ON-state voltage is reduced too much, the turn-off time is increased. Therefore, it is necessary to improve the trade-off relationship between the turn-off time and the ON-state voltage.

Currently, a method for controlling a lifetime of a minority carrier in a semiconductor has widely been employed in order to shorten the turn-off time. The conventional method for controlling a lifetime of a minority carrier is divided broadly into the following two ways.

As a first method, a heavy metal is diffused into a silicon semiconductor (a heavy metal diffusion method). In this method, a deep level generated by a combination of the heavy metal and silicon is utilized as a recombination center. More specifically, the heavy metal is applied (or deposited) on the surface of a silicon substrate, and is then introduced into the silicon substrate by thermal diffusion.

As a second method, ionizing radiation such as an electron beam, a gamma ray or a light ion beam, for example, proton is irradiated on a silicon semiconductor. A deep level generated due to irradiating composite defects which are caused by irradiating the ionizing radiation is utilized as the recombination center. By controlling the energy of the ionizing radiation and an amount of irradiation thereof, the control effects of a lifetime of a minority carrier are adjusted. The first and second methods will be described below in detail, and problems thereof will be described below.

A lifetime $\tau$ of a minority carrier obtained by the first method makes a great difference between devices and between wafers due to the amount of the deposited heavy metal, a variation in a coefficient of diffusion into the silicon, and the like. Consequently, it is hard to perform technological control. If the lifetime $\tau$ of the minority carrier is excessively reduced, a forward voltage drop (a so-called ON-state voltage $V_{on}$) is increased so that the consumed power of a semiconductor device is increased to depart from a standard. Consequently, characteristic failures are caused so that yield is lowered. Furthermore, the heavy metal diffusion method has problems that it is difficult to anticipate characteristics in advance by using means such as a previous test and correction cannot be performed when an amount of thermal diffusion becomes excessive. In addition, if a silicon substrate has crystal defects, the heavy metal causes grain boundary diffusion along the crystal defects. Consequently, non-uniform distribution is promoted by segregation. For this reason, there is a possibility that device operation might become unstable and deteriorated.

In the second method, in the case where ionizing radiation having an energy E is irradiated on the silicon substrate, a difference between inverse numbers of the lifetime of the minority carrier obtained before and after irradiation is proportional to a dose wherein the lifetime of the minority carrier obtained before and after the irradiation is represented by $\tau 0$ and $\tau 1$ respectively and the dose of the ionizing radiation is represented by $\phi$. A coefficient of proportion is given as a coefficient of damage k. More specifically, the following relationship is formed.

$$\Delta \frac{1}{\tau} = \frac{1}{\tau_1} - \frac{1}{\tau_0} = k\phi \qquad (1)$$

The silicon semiconductor on which the ionizing radiation is irradiated is damaged. The damage is broadly divided into a damage on a surface protective film interface and a damage (crystal defect) on the inside of a single crystal (that is, the inside of the silicon substrate). The damage of the surface protective film has a great correlation with the dose $\phi$ and a small correlation with the energy. The damage on the inside of the single crystal has a great correlation with the dose $\phi$, and the distribution thereof is affected by the energy.

Japanese Patent Application Laid-Open Gazette No. 3-245569 has disclosed that the damage of a surface protective film is restrained and a lifetime of a minority carrier caused by crystal defects on the inside of a single crystal is properly shortened if an electron beam or a gamma ray having an energy of 6 MeV or more is irradiated with a lower dose $\phi$, so that a frequency can be increased and a loss can be lowered without a deterioration in a withstand voltage.

However, the crystal defects formed by using the electron beam or gamma ray are distributed over almost a whole area in a direction of a depth of the inside of a semiconductor device. For this reason, the crystal defects are also formed in a position which is not positively related to the electrical characteristics of the semiconductor device. Furthermore, it is difficult to improve the trade-off relationship between an ON-state voltage and a turn-off time.

In order to solve such problems, the following method for controlling a lifetime of a minority carrier has been proposed.

For example, a method for controlling a lifetime of a minority carrier using proton and helium ions has been proposed in Document 1 (Y. Shimizu, Proc. of ISPSD'90 pp.231–235 "Application of a Proton Irradiation Technique to High Voltage Thyristors"), Document 2 (W. Wondrak. Proc. of ISPSD'88 pp.147–152 "PROTON IMPLANTATION FOR SILICON POWER DEVICES"), Document 3 (T. Nakagawa, Proc. of ISPSD'95 pp.84–88 "A NEW HIGH POWER LOW LOSS GTO") and the like.

These have the following characteristics. When light ions such as proton are implanted into a semiconductor at a high energy, crystal defects which are locally generated in the vicinity of a range position are utilized as recombination centers of a minority carrier. By regulating an accelerating energy, the range position in a thyristor is controlled. By regulating the amount of ion irradiation, the lifetime of the minority carrier is controlled.

In the thyristor having a withstand voltage of 10 kV described above, however, a thickness of a silicon substrate has reached several millimeters and the proposal of the above-mentioned documents has been insufficient.

For example, FIG. 14 shows the relationship among a range position $D_{ll}$, a spike voltage $V_{DSP}$ applied during turn-off and an energy loss $E_{off}$, which has been presented by T. Nakagawa in the Document 2. FIG. 15 shows a partial structure of a GTO in the Document 2.

In the Document 2, a proton beam is irradiated from an N emitter layer ($n_E$) side shown in FIG. 15, that is, a cathode plane (K plane) side, and the range position $D_{ll}$ is defined by a distance between a junction of a P base layer ($p_B$) and an N base layer ($n_B$) and the range position. As $D_{ll}$ is increased, that is, an accelerating energy is increased, the spike voltage $V_{DSP}$ applied during turn-off tends to be decreased and the energy loss $E_{off}$ tends to be increased. Consequently, it is apparent that the spike voltage $V_{DSP}$ and the energy loss $E_{off}$ have the trade-off relationship. Thus, another trade-off relationship appears in the technique proposed in the Document 2.

In the case where a thickness of the silicon substrate is increased, it is necessary to implant proton in a deeper position, that is, at a higher energy than in the prior art. FIGS. 16 and 17 show energy attenuation characteristics in the silicon substrate which are obtained by performing implantation at low and high energies. In FIGS. 16 and 17, an axis of abscissa indicates a depth of the silicon substrate, and an axis of ordinate indicates an amount of energy attenuation.

In the case where the implantation is performed at a low energy, most of the energy is attenuated in the vicinity of a range position $R_P$ as shown in FIG. 16. In the case where the implantation is performed at a high energy, energy attenuation is great in a surface position $E_S$ and an amount of the energy attenuation from the surface position $E_S$ to the range position $R_P$ cannot be ignored as shown in FIG. 17. It is supposed that such attenuation is caused by various mechanisms. As one of causes, when the proton has an energy of 4 to 5 MeV or more, it makes nuclear reaction with silicon atoms so that a reactive cross-sectional area is increased. The great energy attenuation from the surface position $E_S$ to the range position $R_P$ means that an amount of crystal defects generated from the surface position $E_S$ to the range position $R_P$ is also increased. Thus, there has been a fear that the locality of crystal defect distribution might collapse to lower the controllability of the lifetime of the minority carrier.

As a method for controlling a lifetime of a minority carrier using a light ion beam which is more advanced, the technique of Document 4 has been proposed (U.S. Pat. No. 4,056,408, Nov. 1, 1977 "REDUCING THE SWITCHING TIME OF SEMICONDUCTOR DEVICES BY NUCLEAR IRRADIATION"). According to the Document 4, separate implantation of an ion beam into forward and backward conducting portions of a semiconductor device (see FIG. 6 of the Document 4), separate implantation of an ion beam into the end and central active portions of the semiconductor device (see FIGS. 7 and 8 of the Document 4) and the like are performed to enhance the function of the semiconductor device. According to this technique, basically, light ions such as H or He are irradiated from one of plane sides of the semiconductor device so that an accelerating energy and an amount of irradiation can be optimized.

As described above, in the conventional method for manufacturing a semiconductor device, the lifetime of the minority carrier has often been controlled by implanting a proton or light ion beam having a high energy. However, the conventional method has problems that the energy is increased so that the spike voltage $V_{DSP}$ applied during turn-off and the energy loss $E_{off}$ have the trade-off relationship, and the locality of the crystal defect distribution collapses so that the controllability of the lifetime of the minority carrier is lowered.

SUMMARY OF THE INVENTION

A first aspect of the present invention is directed to a method for manufacturing a thyristor having a first semiconductor layer of a first conductivity type, a second semiconductor layer of a second conductivity type, and a third semiconductor layer of the first conductivity type sequentially provided, a fourth semiconductor layer of the second conductivity type selectively formed in a surface of the third semiconductor layer, a gate electrode provided in contact with only the third semiconductor layer, a first electrode provided in contact with at least the fourth semiconductor layer, and a second electrode provided in contact with only the first semiconductor layer, comprising the steps of (a) irradiating heavy ions having a predetermined energy from a first electrode side to form a first ion implantation region for shortening a lifetime of a minority carrier in a position in the second semiconductor layer toward the first electrode, and (b) irradiating the heavy ions having the predetermined energy from a second electrode side to form a second ion implantation region for shortening a lifetime of a minority carrier in a position in the second semiconductor layer toward the second electrode.

A second aspect of the present invention is directed to the method for manufacturing a thyristor, wherein the steps (a) and (b) comprise the step of partially forming the first and second ion implantation regions, respectively.

A third aspect of the present invention is directed to the method for manufacturing a thyristor, wherein the step (a) comprises the steps of (a-1) providing a shielding member having a predetermined opening pattern above the first electrode, and (a-2) irradiating the heavy ions from above the shielding member to partially form the first ion implantation region, and the step (b) comprises the steps of (b-1) providing a shielding member having a predetermined opening pattern above the second electrode, and (b-2) irradiating the heavy ions from above the shielding member to partially form the second ion implantation region.

A fourth aspect of the present invention is directed to the method for manufacturing a thyristor, wherein the shielding members have a plurality of openings, each opening length being 100 $\mu$m or more, and the predetermined opening pattern has the openings provided thereon such that an open area ratio is 30% or less.

A fifth aspect of the present invention is directed to the method for manufacturing a thyristor, wherein the step (a) comprises the step of partially forming the first ion implantation region, and the step (b) comprises the step of forming the second ion implantation region over a whole area.

A sixth aspect of the present invention is directed to the method for manufacturing a thyristor, wherein the step (a) comprises the steps of (a-1) providing a shielding member having a predetermined opening pattern above the first electrode, and (a-2) irradiating the heavy ions from above the shielding member to partially form the first ion implantation region, and the step (b) comprises the step of (b-3) irradiating the heavy ions over a whole plane from the second electrode side to form the second ion implantation region over a whole area.

A seventh aspect of the present invention is directed to the method for manufacturing a thyristor, wherein an irradiation ratio of the heavy ions irradiated from above the shielding member to the heavy ions irradiated from the second electrode side ranges from 10:1 to 1:1.

A eighth aspect of the present invention is directed to the method for manufacturing a thyristor, wherein the shielding member has a plurality of openings, each opening length being 100 μm or more, and the predetermined opening pattern has the openings provided thereon such that an open area ratio is 30% or less.

An ninth aspect of the present invention is directed to the method for manufacturing a thyristor, wherein the step (a) comprises the step of (a-3) irradiating the heavy ions over a whole plane from the first electrode side to form the first ion implantation region over a whole area, and the step (b) comprises the step of (b-3) irradiating the heavy ions over a whole plane from the second electrode side to form the second ion implantation region over a whole area.

A tenth aspect of the present invention is directed to the method for manufacturing a thyristor, wherein an irradiation ratio of the heavy ions irradiated from the first electrode side to the heavy ions irradiated from the second electrode side ranges from 0.5:1 to 1:1.

A eleventh aspect of the present invention is directed to the method for manufacturing a thyristor, wherein the heavy ions are Ne, Ar, Kr, C, Si or Ge, the predetermined energy of the heavy ions is 100 MeV or more, and a total irradiation amount of the heavy ions irradiated from the first electrode side and the second electrode side ranges from $2 \times 10^9$ to $2 \times 10^{11}/cm^2$.

An twelfth aspect of the present invention is directed to the method for manufacturing a thyristor, wherein the steps (a) and (b) further comprise the steps of raising a temperature of the thyristor with a temperature gradient of 5° C./min or less prior to irradiation of the heavy ions and keeping the temperature of the thyristor at 350 to 400° C. during the irradiation of the heavy ions, irradiating the heavy ions such that a fluence ratio of the heavy ions irradiated from the first electrode side and the second electrode side is $1 \times 10^9$ pc/cm$^2$·sec or less, and causing the temperature of the thyristor to fall with a temperature gradient of 5° C./min or less after the heavy ions are irradiated.

A thirteenth aspect of the present invention is directed to a thyristor having a first semiconductor layer of a first conductivity type, a second semiconductor layer of a second conductivity type, and a third semiconductor layer of the first conductivity type sequentially provided, a fourth semiconductor layer of the second conductivity type selectively provided in a surface of the third semiconductor layer, a gate electrode provided in contact with only the third semiconductor layer, a first electrode provided in contact with at least the fourth semiconductor layer, and a second electrode provided in contact with only the first semiconductor layer, comprising a first ion implantation region formed by implanting heavy ions in a position in the second semiconductor layer toward the first electrode for shortening a lifetime of a minority carrier, and a second ion implantation region formed by implanting heavy ions in a position in the second semiconductor layer toward the second electrode for shortening a lifetime of a minority carrier.

A fourteenth aspect of the present invention is directed to the thyristor, wherein the first and second ion implantation regions are partially provided.

A fifteenth aspect of the present invention is directed to the thyristor, wherein the first ion implantation region is partially provided, and the second ion implantation region is provided over a whole area.

A sixteenth aspect of the present invention is directed to the thyristor, wherein the first and second ion implantation regions are provided over whole areas.

A seventeenth aspect of the present invention is directed to the thyristor, wherein the heavy ions are Ne, Ar, Kr, C, Si or Ge.

According to the first aspect of the present invention, the first and second ion implantation regions are formed in positions in the second semiconductor layer toward the first and second electrodes, respectively. Consequently, an ON-state voltage is reduced during the operation of a thyristor by the presence of the first ion implantation region, and a tail current is reduced during turn-off by the presence of the second ion implantation region. As a result, the trade-off relationship between the ON-state voltage and the turn-off time can be improved. Thus, it is possible to manufacture a thyristor which attains a high frequency and a low loss.

According to the second aspect of the present invention, the first and second ion implantation regions are partially formed. Therefore, a non-implantation region is present between the first and second ion implantation regions. By controlling a lifetime of a minority carrier depending on areas of the first and second ion implantation regions and the area of the non-implantation region, the ON-state voltage and the turn-off time can be controlled. Consequently, the trade-off relationship can be changed optionally.

According to the third aspect of the present invention, it is possible to implement a thyristor in which the first and second ion implantation regions are partially formed.

According to the fourth aspect of the present invention, the first ion implantation region is partially formed and the second ion implantation region is formed over the whole area. Consequently, the turn-off time can be shortened and the ON-state voltage can be controlled. Therefore, the trade-off relationship between the ON-state voltage and the turn-off time can be improved. In addition, the ON-state voltage is controlled so that the trade-off relationship can be changed optionally.

According to the fifth aspect of the present invention, it is possible to implement a thyristor in which the first ion implantation region is partially formed and the second ion implantation region is formed over the whole area.

According to the sixth aspect of the present invention, the irradiation ratio of the heavy ions ranges from 10:1 to 1:1. Consequently, the trade-off relationship between the ON-state voltage and the turn-off time can be changed to optional characteristics.

According to the seventh aspect of the present invention, the opening length of the opening of the shielding member is set to 100 μm or more and the open area ratio thereof is set to 30% or less. Consequently, the trade-off relationship between the ON-state voltage and the turn-off time can be optimized. Thus, the turn-off time can be prevented from becoming longer in addition to a reduction in the ON-state voltage.

According to the eighth aspect of the present invention, the first and second ion implantation regions are formed over the whole area. Consequently, the ON-state voltage can be reduced and the turn-off time can be shortened. Thus, the trade-off relationship between the ON-state voltage and the turn-off time can be improved.

According to the ninth aspect of the present invention, the irradiation ratio of the heavy ions is set to 0.5:1 to 1:1. Consequently, the trade-off relationship between the ON-state voltage and the turn-off time in which main improvement of the ON-state voltage or the turn-off time can be selected can be changed to optional characteristics.

According to the tenth aspect of the present invention, any of Ne, Ar, Kr, C, Si and Ge is implanted as the heavy ions. Therefore, in the case where the second semiconductor layer is a silicon layer, there is no problem that a reactive cross-sectional area is increased. Consequently, energy attenuation caused before a range position is reached is diminished. Accordingly, an amount of crystal defects generated before the range position is reached is restrained so that the locality of crystal defect distribution can be maintained. Thus, the controllability of the lifetime of the minority carrier can be prevented from being lowered. Furthermore, the predetermined energy of the heavy ions is set to 100 MeV or more. Therefore, also in the thyristor whose first and third semiconductor layers have greater thicknesses with an increase in the withstand voltage, the heavy ions can be implanted in the predetermined position of the third semiconductor layer through the first and third semiconductor layers. In addition, the total irradiation amount of the heavy ions is set to $2\times10^9$ to $2\times10^{11}/cm^2$. Consequently, a time required to perform ion implantation can be reduced considerably, and furthermore the manufacturing cost of the thyristor can be lowered.

According to the eleventh aspect of the present invention, the temperature of the thyristor is raised with a temperature gradient of 5° C./min or less and is caused to fall with a temperature gradient of 5° C./min or less. Consequently, the generation of thermal distortion can be prevented so that the damage of the thyristor can be prevented. By performing ion irradiation with the temperature of the thyristor kept at 350 to 400° C., unstable crystal defects generated by the ion implantation can be recovered and canceled by annealing simultaneously with generation and comparatively stable composite defects to function as recombination centers can be left. Thus, unnecessary collapse of a crystal structure can be restrained and conductivity can be kept. Furthermore, the fluence ratio is limited to $1\times10^9$ pc/cm$^2$ sec or less so that various crystal defects generated by an ion can be prevented from being further disturbed by succeeding ions and growing into more macro crystal defects before they are recovered and canceled by the annealing. Thus, it is possible to prevent the structures of the crystal defects from differing due to a difference in the fluence ratio even if the total irradiation amounts are equal. In addition, it is possible to prevent electrical characteristics from differing due to a difference in the structure of the crystal defect. Consequently, a thyristor having uniform electrical characteristics can be manufactured.

According to the twelfth aspect of the present invention, the first and second ion implantation regions are formed in positions in the second semiconductor layer toward the first and second electrodes. Consequently, an ON-state voltage is reduced during the operation of the thyristor by the presence of the first ion implantation region, and a tail current is reduced during turn-off by the presence of the second ion implantation region. As a result, the trade-off relationship between the ON-state voltage and the turn-off time can be improved. Thus, it is possible to obtain a thyristor which attains a high frequency and a low loss.

According to the thirteenth aspect of the present invention, the first and second ion implantation regions are partially formed. Therefore, a non-implantation region is present between the first and second ion implantation regions. By controlling the areas of the first and second ion implantation regions and the area of the non-implantation region, the trade-off relationship can be changed optionally. Thus, it is possible to obtain a thyristor corresponding to users' needs such as an increase in a frequency or a reduction in a loss.

According to the fourteenth aspect of the present invention, the first ion implantation region is partially formed and the second ion implantation region is formed over the whole area. Consequently, the turn-off time can be reduced, and the ON-state voltage can be controlled to change the trade-off relationship optionally. Thus, it is possible to obtain a thyristor corresponding to users' needs such as an increase in a frequency or a reduction in a loss.

According to the fifteenth aspect of the present invention, the first and second ion implantation regions are formed over the whole area. Consequently, the ON-state voltage can be reduced and the turn-off time can be shortened. Therefore, the trade-off relationship between the ON-state voltage and the turn-off time can be improved. Thus, it is possible to obtain a thyristor which attains a high frequency and a low loss.

According to the sixteenth aspect of the present invention, the heavy ions are Ne, Ar, Kr, C, Si or Ge. Therefore, in the case where the second semiconductor layer is a silicon layer, there is no problem that a reactive cross-sectional area is increased during implantation. Consequently, a lot of crystal defects are not present before an implantation position is reached so that the locality of crystal defect distribution can be kept. Consequently, it is possible to prevent the controllability of the lifetime of the minority carrier from being lowered. Thus, a thyristor having desired characteristics can be obtained.

In order to solve the above-mentioned problems, it is an object of the present invention to provide a method for manufacturing a thyristor and a thyristor in which a lifetime of a minority carrier is controlled to improve the trade-off relationship between an ON-state voltage and a turn-off time and attain a high frequency and a low loss.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Embodiment>

A method for controlling a lifetime of a minority carrier according to a first embodiment of the present invention will be described below with reference to FIGS. 1 to 7.

<A-1. Structure of High Withstand Voltage Thyristor>

Figure 1:
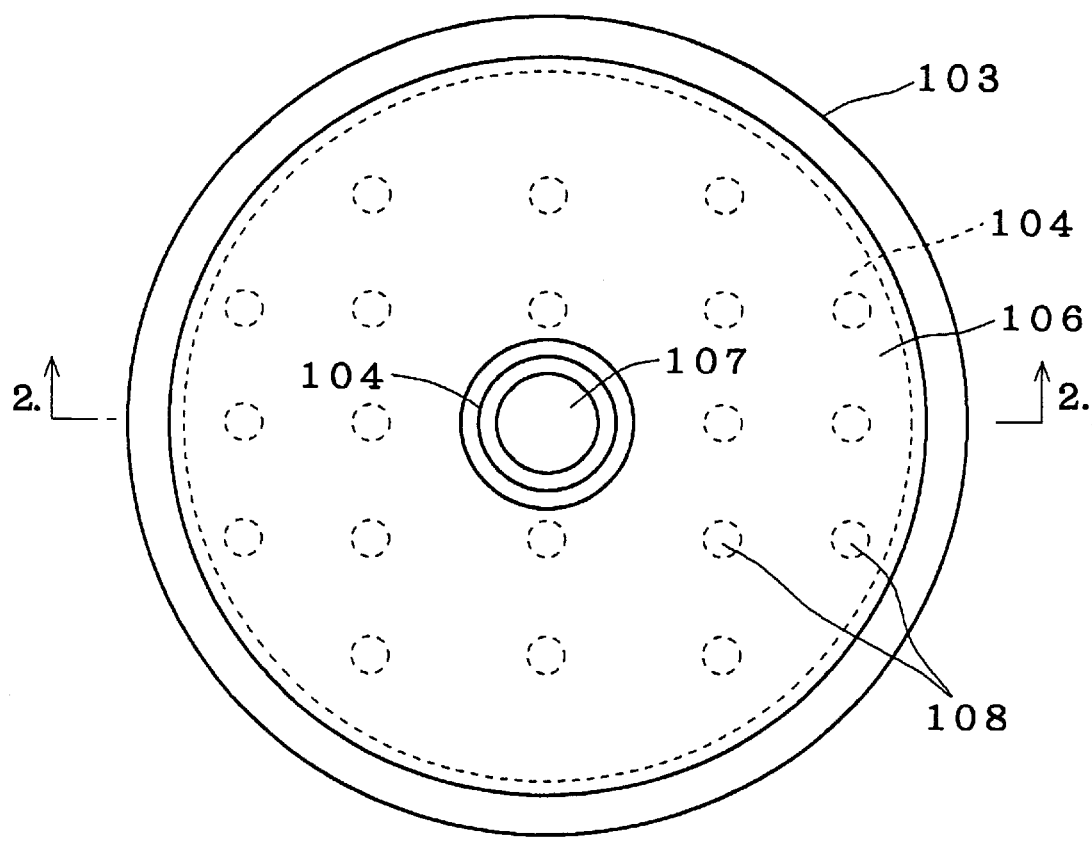
FIG. 1 is a plan view showing a structure of a high withstand voltage thyristor.
Figure 2:
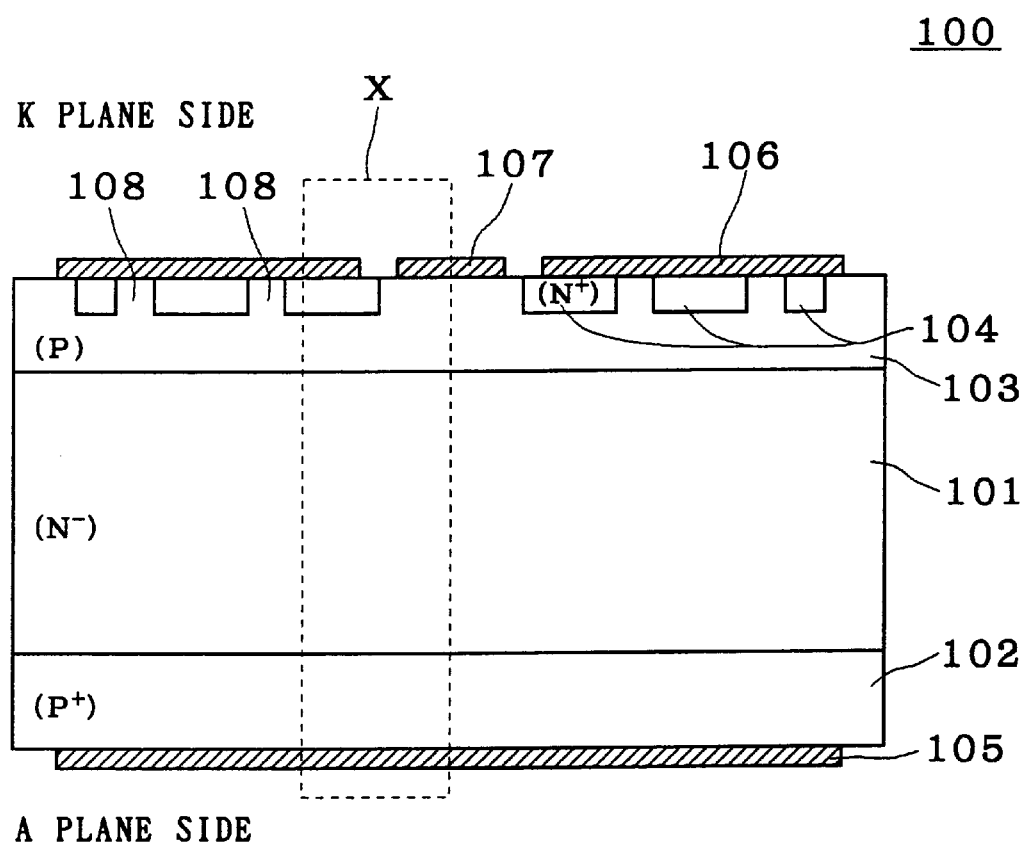
FIG. 2 is a sectional view showing the structure of the high withstand voltage thyristor.

FIG. 1 is a plan view showing a structure of a general high withstand voltage thyristor 100, and FIG. 2 is a sectional view taken along the line A—A of FIG. 1. As shown in FIG. 2, the high withstand voltage thyristor 100 comprises an anode electrode 105 (a second electrode), and a P⁺ diffusion layer 102 (a first semiconductor layer) corresponding to a P⁺ anode layer, an N⁻ silicon substrate 101 (a second semiconductor layer) having a high specific resistivity which corresponds to an N base layer, and a P diffusion layer 103 (a third semiconductor layer) corresponding to a P base layer which are sequentially provided on the anode electrode 105.

A gate electrode 107 is provided on the center of the P diffusion layer 103. An N⁺ diffusion region 104 (a fourth semiconductor layer) corresponding to an N⁺ cathode region is formed in a surface of the P diffusion layer 103 so as to surround the P diffusion layer 103 provided under the gate electrode 107. The N⁺ diffusion region 104 partially has an exposed portion 108. In the exposed portion 108, the P diffusion layer 103 is exposed. A cathode electrode 106 (a first electrode) is provided on the surface of the P diffusion layer 103 so as to surround the gate electrode 107. The high withstand voltage thyristor 100 acts as a P gate thyristor in which the gate electrode 107 is formed on the P diffusion layer 103. The present invention can also be applied to an N gate thyristor in which a gate electrode is formed on an N type semiconductor layer.

<A-2. Specific Method for Controlling Lifetime of Minority Carrier>

By taking, as an example, the structure of the high withstand voltage thyristor 100 described above, a method for controlling a lifetime of a minority carrier will be described below.

<A-2-1. Form of Ion Implantation>

Figure 3:
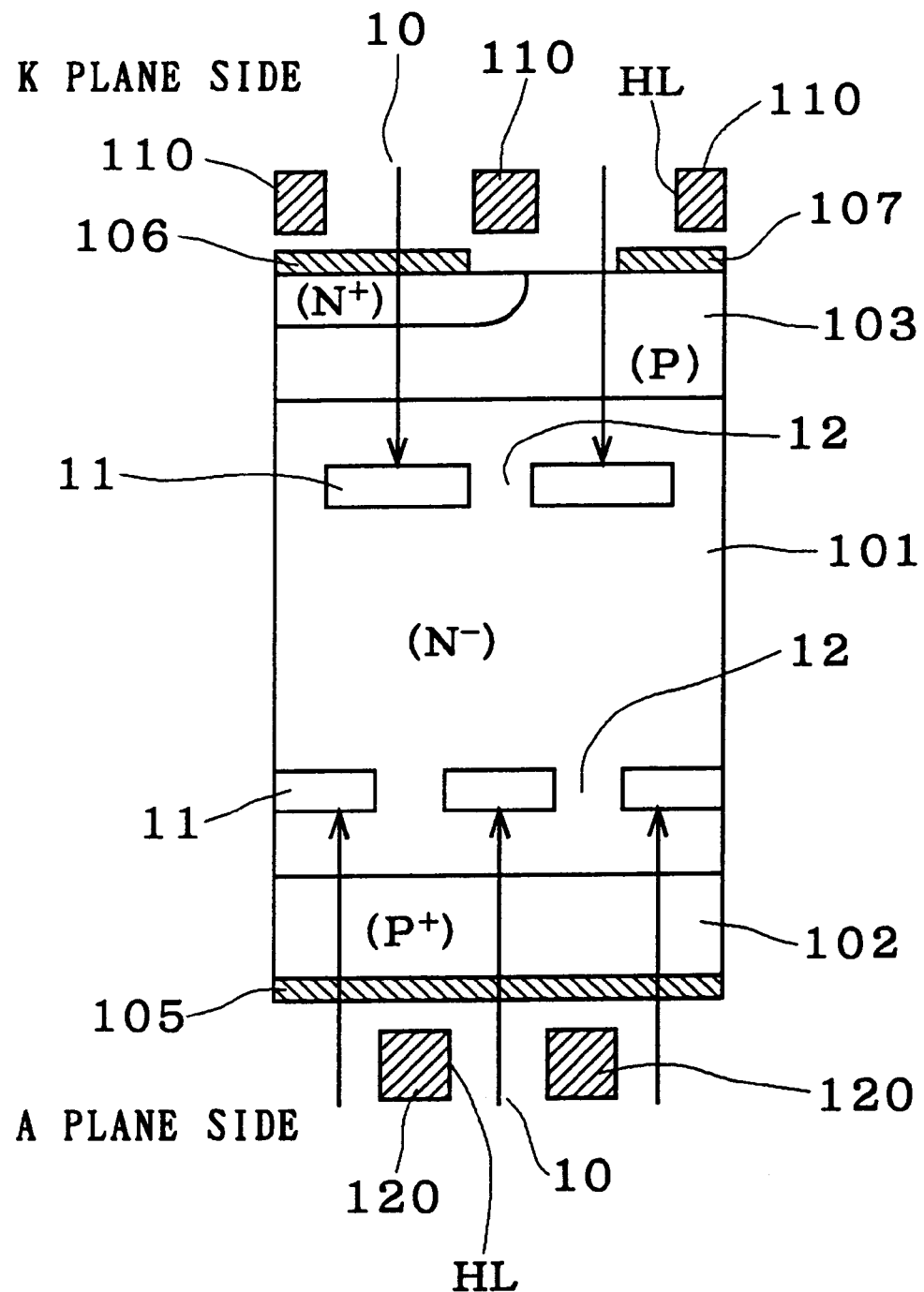
FIG. 3 is a view for explaining a first embodiment according to the present invention.

The form of ion implantation will be described below with reference to FIG. 3 showing a portion similar to a region X enclosed by a broken line in FIG. 2. In FIG. 3, shielding members 110 and 120 formed of metal plates are provided in spaces above the surface of the P diffusion layer 103 on which the cathode electrode 106 is provided (hereinafter referred to as a K plane) and a surface of the P⁺ diffusion layer 102 on which the anode electrode 105 is provided (hereinafter referred to as an A plane). The shielding members 110 and 120 do not completely shield the K and A planes but have a plurality of partial openings HL, respectively.

When a heavy ion beam 10 having a high energy such as Ne (neon) which is accelerated to 100 MeV or more, for example, is irradiated from K and A plane sides onto the high withstand voltage thyristor 100 on which the shielding members 110 and 120 are provided, the heavy ion beam 10 having a high energy is implanted from the openings HL of the shielding members 110 and 120 so that an ion implantation region 11 is partially formed at a depth corresponding to an energy (accelerating energy). An ion to be used is not restricted to Ne but may be Ar (argon), Kr (krypton), C (carbon), Si (silicon), Ge (germanium) or the like. The accelerating energy is set to 100 MeV or more because the thicknesses of the P⁺ diffusion layer 102 and the P diffusion layer 103 are also great with an increase in a withstand voltage and the heavy ions are caused to reach predetermined depths of the N⁻ silicon substrate 101 therethrough.

Formation depths of the ion implantation region 11 are set such that the ion implantation region 11 is provided, on the K plane side, in the N⁻ silicon substrate 101 inside a junction face of the P diffusion layer 103 and the N⁻ silicon substrate 101, and is provided, on the A plane side, in the N⁻ silicon substrate 101 inside a junction face of the P⁺ diffusion layer 102 and the N⁻ silicon substrate 101. The ion implantation region 11 is formed by implanting ions of the same species. Therefore, the same reference numeral is attached to the K and A plane sides. For convenience, the ion implantation region provided on the K plane side is indicated at 11a and the ion implantation region provided on the A plane side is indicated at 11b. In addition, the ion implantation regions 11a and 11b will be hereinafter referred to as first and second ion implantation regions, respectively, in the same manner as in the following embodiments.

In FIG. 3, the ion implantation region 11 is formed on the K and A plane sides in the N⁻ silicon substrate 101. On the N⁻ silicon substrate 101 between the adjacent ion implantation regions 11, the heavy ion beam 10 having a high energy is shielded by the shielding members 110 and 120. As a result, the N⁻ silicon substrate 101 between the adjacent ion implantation regions 11 acts as a non-implantation region 12 in which the ions are not implanted.

In the ion implantation region 11, the crystalline properties of a silicon are damaged by the implanted heavy ions so that crystal defects are generated. When operating the high withstand voltage thyristor 100, a deep level is formed by the crystal defects and acts as a recombination center of a minority carrier. Consequently, the lifetime of the minority carrier is shortened and a rate at which the minority carrier can pass through this region is reduced.

<A-2-2. Function and Effect of Partial Both-side Implantation>

The function of partially forming the ion implantation region 11 on the K and A plane sides in the N⁻ silicon substrate 101 will be described below.

Figure 4:
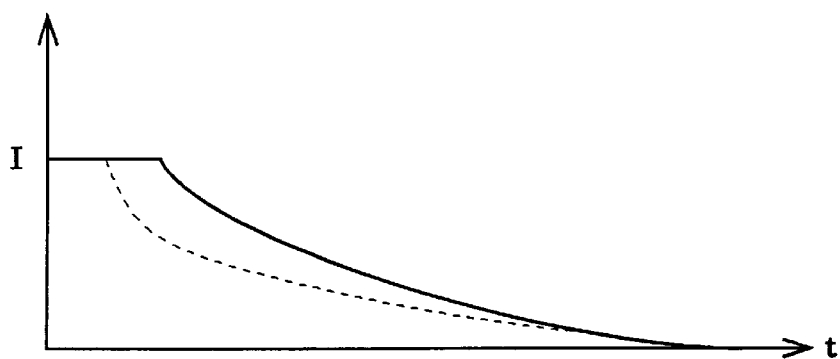
FIG. 4 is a chart showing characteristics with the passage of time of a turn-off current which are obtained when ion implantation is performed over a whole plane from a cathode side.
Figure 5:
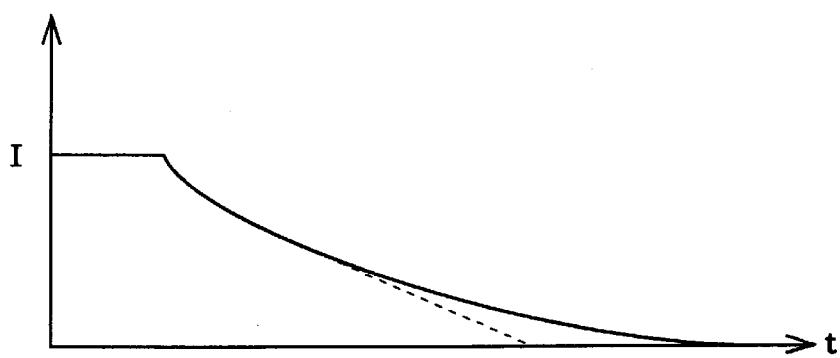
FIG. 5 is a chart showing the characteristics with the passage of time of a turn-off current which are obtained when the ion implantation is performed over the whole plane from an anode side.

FIGS. 4 and 5 show characteristics with the passage of time of a current applied during turn-off which are obtained when ion implantation is performed over a whole plane from the K and A plane sides. In FIGS. 4 and 5, the characteristics shown in a solid line are obtained when the ion implantation is not performed, and the characteristics shown in a broken line are obtained when the ion implantation is performed.

As shown in FIG. 4, when the ion implantation is performed over the whole plane from the K plane side, the characteristics are remarkably changed in the early stage of turn-off. Consequently, an ON-state voltage is lowered. This effect is obtained because a minority carrier which is excessively present partially from the ion implantation region 11 toward the cathode side in the N base layer, that is, the N⁻ silicon substrate 101 in the early stage of turn-off is mainly recombined so that the lifetime is reduced. Then, a depletion layer which extends from the P base layer, that is, the P diffusion layer 103 covers the ion implantation region 11. For this reason, a recombination ratio in the ion implantation region 11 is lowered. Thus, a tail current is not affected.

As shown in FIG. 5, when the ion implantation is performed over the whole plane from the A plane side, the tail current is reduced as opposed to FIG. 4. This occurs because the minority carrier which is excessively present partially from the ion implantation region 11 toward the anode side in the N base layer, that is, the N⁻ silicon substrate 101 in the early stage of turn-off and a residual carrier implanted from an anode are recombined so that the lifetime is reduced. The effect is held until the depletion layer covers the ion implantation region 11 to lower the recombination ratio.

In the above description, the ion implantation is performed over the whole plane from the K and A plane sides. Also in the case where the ion implantation is partially performed from the K and A plane sides, the same functions are offered. However, since the non-implantation region 12 is present, the effect is diminished.

Due to the presence of the non-implantation region 12 on the K plane side in the N⁻ silicon substrate 101, the minority carrier which is excessively present partially toward a cathode in the N base layer, that is, the N⁻ silicon substrate 101 in the early stage of turn-off is not recombined at a certain rate but passes through the non-implantation region 12. In other words, the lifetime becomes longer. Accordingly, there is a less change than in the characteristics shown in the broken line of FIG. 4. Consequently, the effect of reducing the ON-state voltage is restrained.

Due to the presence of the non-implantation region 12 on the A plane side in the N⁻ silicon substrate 101, a minority carrier which is excessively present partially from the ion implantation region 11 toward the anode side and a residual carrier implanted from an anode are not recombined at a certain rate but pass through the non-implantation region 12. In other words, the lifetime becomes longer. Accordingly, there is a less change than in the characteristics shown in the broken line of FIG. 5. In other words, the effect of shortening a turn-off time is restrained.

As described above, the ion implantation region 11 is partially formed on the K and A plane sides in the N⁻ silicon substrate 101 respectively so that the non-implantation region 12 is formed. By controlling the lifetime of the minority carrier depending on the areas of the ion implantation region 11 and the non-implantation region 12, the ON-state voltage and the turn-off time can be controlled. While the lifetime of the minority carrier is also affected by the thickness of the ion implantation region 11, only the areas are taken into consideration.

<A-2-3. Shape of Shielding Member>

If the rate of the area of the non-implantation region 12 is excessively increased, the minority carrier which passes through the non-implantation region 12 and is not recombined during turn-off forms a tail having a current waveform. Consequently, the turn-off time becomes longer so that an energy loss is increased. On the other hand, if the rate of the area of the non-implantation region 12 is excessively reduced, the ON-state voltage is increased so that the energy loss is increased. For this reason, the area of the ion implantation region 11, the area ratio of the ion implantation region 11 to the non-implantation region 12, that is, the dimensions of openings of the shielding members 110 and 120 and open area ratios thereof are determined in consideration of the ON-state voltage and the turn-off time having the trade-off relationship.

Figure 6:
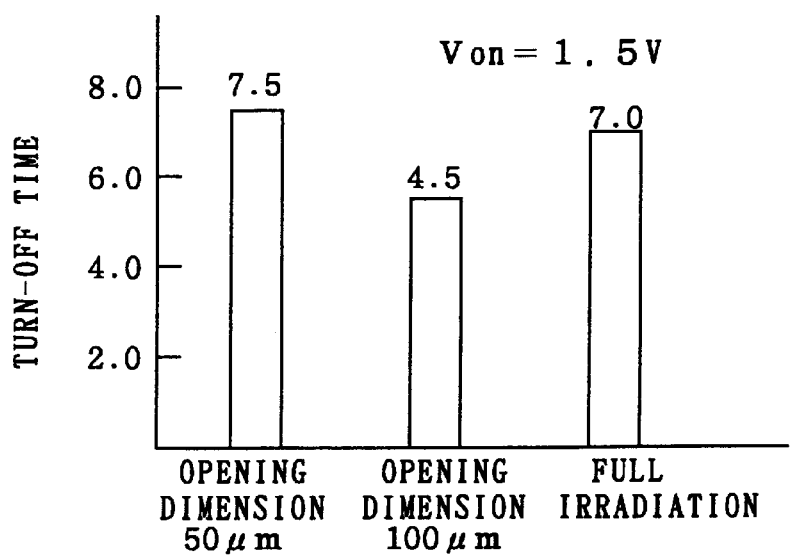
FIG. 6 is a chart showing the relationship between a partial irradiation pattern obtained by simulation and a turn-off time.

FIG. 6 shows the relationship between the dimension of an opening HL of the shielding member which is obtained by device simulation and the turn-off time. This simulation is a result obtained when the shielding member is provided on either of the K and A plane sides of the high withstand voltage thyristor 100. The dimension of the opening HL of the shielding member represents a diameter when the plane shape of the opening HL is circular, and represents a length of a side when the plane shape of the opening HL is square.

FIG. 6 shows a simulation result obtained when an open area ratio to be described below is 30%. In FIG. 6, "full irradiation" represents the case where ion irradiation is performed over the whole plane on the K or A plane side of the high withstand voltage thyristor 100 without using the shielding member. In order to compensate for a gap in effects caused by a difference in irradiation amounts, comparison is performed on the constant condition that an ON-state voltage $V_{on}$ is 1.5 V.

As is apparent from FIG. 6, the turn-off time is shortened to about 60% on the condition that the dimension of the opening is 100 μm as compared with the full irradiation. However, when the dimension of the opening is set to 50 μm, the turn-off time is increased by about 10% as compared with the full irradiation.

It is supposed that the reason is as follows. In the high withstand voltage thyristor, a silicon substrate having few crystal defects such as composite defects and a high specific resistivity (500 Ω·cm or more) is used. Therefore, the lifetime is also increased (500 μsec or more). Consequently, when the area of the ion implantation region is excessively reduced, the rate of the minority carrier which passes around the ion implantation region during turn-off is increased. Thus, the effect of controlling the lifetime of the minority carrier is diminished.

FIG. 6 shows a simulation result obtained when the open area ratio is 30%. The reason is that the turn-off time is shortened most greatly when the open area ratio is 30% as a result of simulation with various values.

From the above-mentioned results, the dimensions of the openings of the shielding members 110 and 120 have optimum values of 100 μm or more, and the open area ratios thereof have optimum values of 30% or less.

In general, a ratio of stopping power of a silicon and a metal to an ion beam is about one to three. In the case where the shielding members 110 and 120 are formed of stainless steel, for example, a thickness of the stainless steel should be about 100 μm in order to shield ions having an energy whose range in the silicon substrate is about 300 um. As a method for manufacturing the shielding members 110 and 120, consequently, a plurality of circular holes having a diameter of 100 μm or square holes having a side of 100 μm are formed by isotropic etching on a metal plate (such as stainless steel) having a thickness of 100 um, for example. At this time, a pattern space is adjusted such that the open area ratio is 30% or less.

Figure 7:
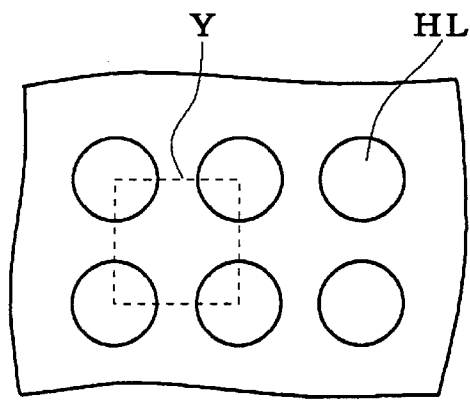
FIG. 7 is a view for explaining a method for calculating an open area ratio.

A method for calculating the open area ratio will be described below with reference to FIG. 7. FIG. 7 is a partial plan view showing the shielding members 110 and 120, in which the opening HL is a circular hole. In FIG. 7, a rectangular region Y is obtained by connecting the centers of four circular holes which are formed adjacently to each other. The open area ratio is obtained by comparing the area of the rectangular region Y with the area of the openings in the region Y.

The plane shapes of the shielding members 110 and 120 are circles having almost the same dimension as that of the high withstand voltage thyristor 100. The opening HL is provided over almost the whole planes of the shielding members 110 and 120. The shielding members 110 and 120 are provided so as to cover the whole K and A planes of the high withstand voltage thyristor 100. In a providing method, the shielding members 110 and 120 are fixed on this side of a position in which the high withstand voltage thyristor 100 is provided in respect of a path of an ion beam, and the high withstand voltage thyristor 100 is provided in a predetermined position to perform irradiation. After the irradiation is completed on one of the planes, the irradiation is performed on the other plane. Every time the openings HL of the shielding members 110 and 120 have different patterns (as shown in FIG. 3, for example), the shielding members are exchanged. With such a structure, ions can be implanted into a plurality of high withstand voltage thyristors 100 by using a pair of shielding members 110 and 120. Consequently, an increase in cost can be restrained.

Furthermore, a pair of shielding members 110 and 120 are exclusively attached to only one high withstand voltage thyristor 100. During the irradiation, the high withstand voltage thyristor 100 having the shielding members 110 and 120 attached thereto is provided in a predetermined position. With such a structure, alignment of the shielding members 110 and 120 with the high withstand voltage thyristor 100 can be adjusted accurately.

<A-2-4. Maintenance of Locality of Crystal Defect Distribution>

Figure 17:
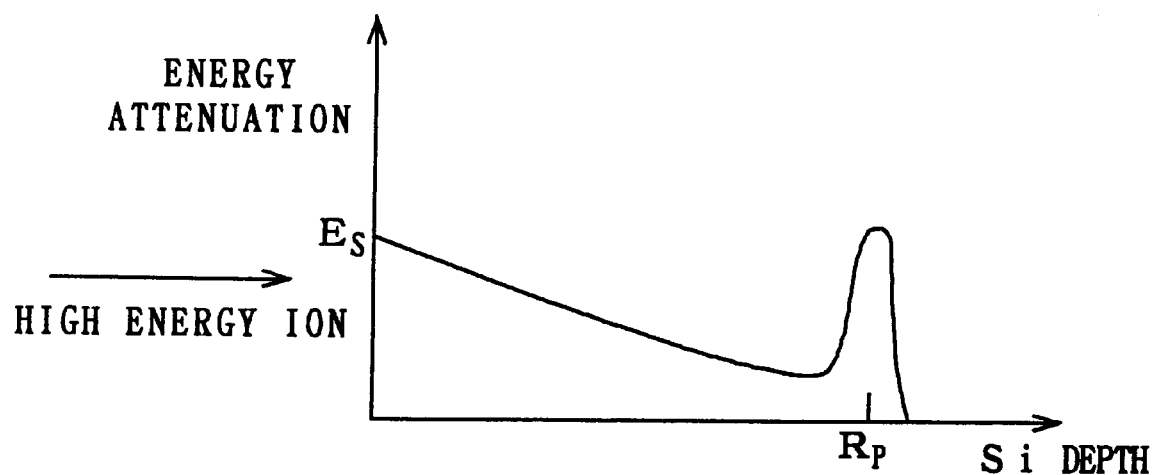
FIG. 17 is a chart for explaining the difference in the energy attenuation profile in the silicon which is caused by the difference in the accelerating energy.

In the case where heavy ions having a high energy are implanted, the locality of crystal defect distribution can also be maintained. As described above with reference to FIG. 17, in the case where proton ions having a high energy are implanted, energy attenuation is great in a surface position $E_S$. Consequently, the energy attenuation from the surface position $E_S$ to a range position $R_P$ cannot be ignored. In the case where heavy ions such as Ne, Ar, Kr, C, Si and Ge are used, an energy at which these ions cause nuclear reaction with silicon atoms is greater than an accelerating energy. For this reason, there is no problem that a reactive cross-sectional area is increased. Consequently, the energy attenuation from the surface position $E_S$ to the range position $R_P$ is decreased. Accordingly, an amount of crystal defects generated from the surface position $E_S$ to the range position $R_P$ is also limited. As a result, the locality of the crystal defect distribution can be maintained and the controllability of the lifetime of the minority carrier can be prevented from being lowered.

<A-3. Characteristic Function and Effect>

According to the first embodiment of the present invention described above, the ion implantation region 11 is partially formed on the K and A plane sides in the N⁻silicon substrate 101, respectively. Consequently, the ON-state voltage and the turn-off time can be controlled depending on the area of the non-implantation region 12. Accordingly, the trade-off relationship between the ON-state voltage and the turn-off time can be optionally varied by controlling the area of the non-implantation region 12, that is, the area of the ion implantation region 11.

Furthermore, the openings of the shielding members 110 and 120 have dimensions of 100 μm or more and open area ratios of 30% or less. Consequently, the trade-off relationship between the ON-state voltage and the turn-off time can be optimized and an increase in the turn-off time can be restrained in addition to a reduction in the ON-state voltage.

When adding the above-mentioned characteristics, it is sufficient that a device for irradiating a heavy ion beam 10 having a high energy and the shielding members 110 and 120 are prepared. The high withstand voltage thyristor 100 has the same structure as in the prior art. Therefore, a novel technique for manufacturing the high withstand voltage thyristor 100 is not necessary.

A device for accelerating the heavy ion such as Ne to have a high energy of 100 MeV or more is currently limited worldwide. It is fully possible to manufacture the high withstand voltage thyristor 100 according to conventional process and then transfer the high withstand voltage thyristor 100 to facilities having the same device so as to perform predetermined ion implantation. In Takasaki Radiation Chemistry Research Establishment Japan Atomic Energy Research Institute, the industrial utilization of such a heavy ion beam having a high energy has been studied.

<B. Second Embodiment>

A method for controlling a lifetime of a minority carrier according to a second embodiment of the present invention will be described below with reference to FIGS. 8 and 9.

<B-1. Specific Method for Controlling Lifetime of Minority Carrier>

While the method for partially forming the ion implantation region 11 on the K and A plane sides in the N⁻silicon substrate 101 has been described in the first embodiment according to the present invention with reference to FIGS. 1 to 7, an ion implantation region may be formed over a whole area on one of the plane sides and the ion implantation region may be partially formed on the other plane side as described above. As the second embodiment according to the present invention, an example in which the ion implantation region is formed over the whole ares on one of the plane sides will be described below.

<B-1-1. Form of Ion Implantation>

Figure 8:
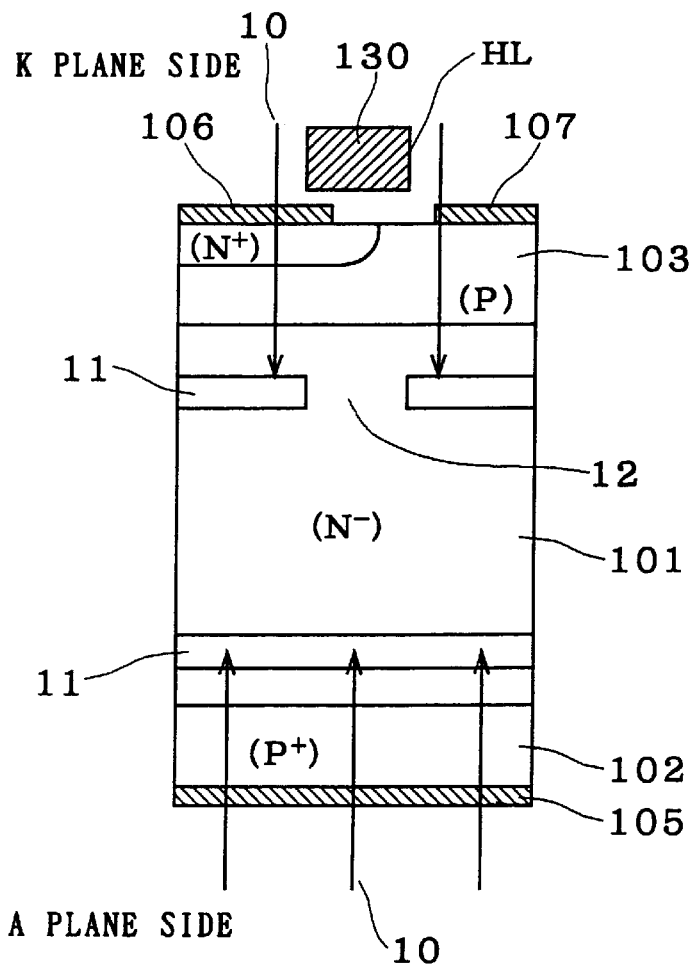
FIG. 8 is a view for explaining a second embodiment of the present invention.

The form of ion implantation will be described below with reference to FIG. 8 showing a portion similar to the region X enclosed by the broken line in FIG. 2. In FIG. 8, a shielding member 130 formed of a metal plate is provided in a space above a K plane. The shielding member 130 does not completely shield the K plane but has a plurality of partial openings HL. The shielding member is not provided in a space above an A plane.

When a heavy ion beam 10 having a high energy such as Ne is irradiated from a K plane side onto a high withstand voltage thyristor 100 in which the shielding member 130 is provided in only the space above the K plane, the heavy ion beam 10 having a high energy is implanted from the openings HL of the shielding member 130 so that an ion implantation region 11 is partially formed at a depth corresponding to an energy (accelerating energy). When the heavy ion beam 10 having a high energy is irradiated from an A plane side, the ion implantation region 11 is formed over the whole area at a depth corresponding to an energy (accelerating energy).

Formation depths of the ion implantation region 11 are set such that the ion implantation region 11 is provided, on the K plane side, in an N⁻ silicon substrate 101 inside a junction face of a P diffusion layer 103 and the N⁻ silicon substrate 101, and is provided, on the A plane side, in the N⁻ silicon substrate 101 inside a junction face of a P⁺ diffusion layer 102 and the N⁻ silicon substrate 101.

In FIG. 8, the ion implantation region 11 is formed on the K and A plane sides in the N⁻ silicon substrate 101, respectively. Between the adjacent ion implantation regions 11 on the K plane side, the heavy ion beam 10 having a high energy is shielded by the shielding member 130. As a result, the N⁻ silicon substrate 101 between the adjacent ion implantation regions 11 acts as a non-implantation region 12 in which the ions are not implanted. The ion implantation region 11 on the A plane side is formed over the whole area of the N⁻ silicon substrate 101 in a plane direction thereof.

<B-1-2. Function and Effect of Partial Single-side Implantation and Full Single-side Implantation>

The function and effect obtained by partially forming the ion implantation region 11 on the K plane side in the N⁻ silicon substrate 101 and forming the ion implantation region 11 over the whole area on the A plane side will be described below.

As described in the first embodiment, the effect that the ON-state voltage can be controlled depending on the areas of the ion implantation region 11 and the non-implantation region 12 is obtained by partially forming the ion implantation region 11 on the K plane side. As described above with reference to FIG. 5, the effect that the tail current can be reduced and the turn-off time can be shortened is obtained by forming the ion implantation region 11 over the whole area on the A plane side. By combining both effects, accordingly, the turn-off time can be shortened and the ON-state voltage can be controlled. Consequently, the trade-off relationship between the ON-state voltage and the turn-off time can be improved and can be optionally changed by controlling the ON-state voltage.

An amount of ions irradiated from the K plane side is represented by $\Phi_K$, an amount of ions irradiated from the A plane side is represented by $\Phi_A$, and a total amount of ions irradiated from both planes is represented by $\Phi_{tot}$. By varying a ratio of $\Phi_K$ to $\Phi_A$, the trade-off relationship between the ON-state voltage and the turn-off time can be changed to optional characteristics.

More specifically, the ON-state voltage can be mainly improved by varying the ratio of $\Phi_K$ to $\Phi_A$ within the range of 10:1 to 2:1, and the turn-off time can be mainly improved by varying the ratio of $\Phi_K$ to $\Phi_A$ within the range of 2:1 to 1:1.

Figure 9:
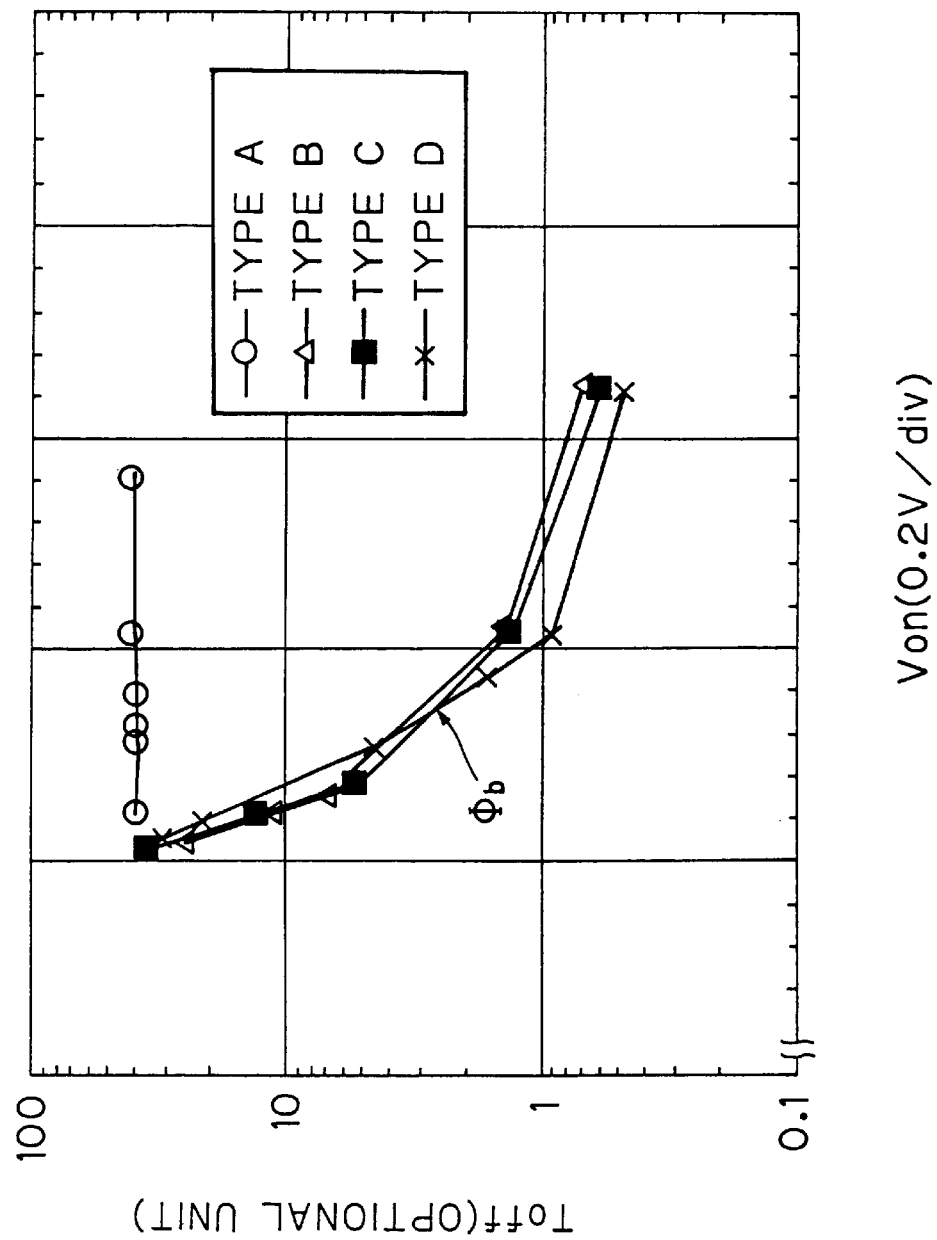
FIG. 9 is a chart showing the state of a variation in the trade-off relationship between an ON-state voltage and a turn-off time for a change in an irradiation ratio of heavy ions.

FIG. 9 shows the state of a change in the trade-off relationship between the ON-state voltage and the turn-off time for a variation in the ratio of $\Phi_K$ to $\Phi_A$. FIG. 9 shows the trade-off relationship, in which an axis of abscissa indicates an ON-state voltage $V_{on}$, an axis of ordinate indicates a turn-off time $T_{off}$, the ratio of $\Phi_K$ to $\Phi_A$ is classified into four types A to D, and the total irradiation amount Φtot from both planes is varied. In FIG. 9, the total irradiation amount Φtot is increased from left to right.

The type A represents a result obtained by performing full irradiation from the K plane side in the same manner as in the prior art. The types B to D represent results obtained by performing partial irradiation from the K plane side and full irradiation from the A plane side. In the type B, the ratio of $\Phi_K$ to $\Phi_A$ is 1:1. In the type C, the ratio of $\Phi_K$ to $\Phi_A$ is 2:1. In the type D, the ratio of $\Phi_K$ to $\Phi_A$ is 10:1.

In respect of the characteristics of the types B to D in FIG. 9, the following is apparent. As the total irradiation amount $\Phi_{tot}$ ($\Phi_K+\Phi_A$) is increased, a characteristic value of trade-off is displaced from upper left to lower right in each type. A tendency to the displacement is not constant but is changed by setting, as a boundary, the vicinity of a position $\Phi_b$ shown by an arrow.

The total irradiation amount corresponding to the position $\Phi_b$ shown by the arrow will be hereinafter referred to as a critical irradiation amount. By setting the critical irradiation amount $\Phi_b$ as a boundary, the trade-off relationship is improved in order of the types B, C and D in a region of $\Phi_{tot}<\Phi_b$, and is improved in order of the types D, C and B in a region of $\Phi_{tot}>\Phi_b$. Accordingly, the ratio of $\Phi_K$ to $\Phi_A$ is selected depending on whether a product has the ON-state voltage lowered or the turn-off time shortened.

In the case where the product having the ON-state voltage lowered is desired, the total irradiation amount $\Phi_{tot}$ is made smaller than the critical irradiation amount $\Phi_b$ and the ratio of $\Phi_K$ to $\Phi_A$ is set to about 1:1. Consequently, it is possible to obtain a product in which an increase in the turn-off time is also restrained.

In the case where the product having the turn-off time shortened is desired, the total irradiation amount $\Phi_{tot}$ is made larger than the critical irradiation amount $\Phi_b$ and the ratio of $\Phi_K$ to $\Phi_A$ is set to about 10:1. Consequently, it is possible to obtain a product in which an increase in the ON-state voltage is also restrained.

By limiting the ratio of $\Phi_K$ to $\Phi_A$ to the range of 10:1 to 1:1, it is also possible to restrain a deterioration in gate characteristics obtained during ON control action (the relationship between a gate voltage $V_{GT}$ and a gate current $I_{GT}$).

The reason why the deterioration in the gate characteristics can be restrained is as follows. The partial irradiation is performed from the K plane side to form the non-implantation region 12. Consequently, that portion has the same gate characteristics as in a conventional thyristor. Accordingly, a region having the same gate characteristics as in the conventional thyristor and a region having the gate characteristics deteriorated (that is, the ion implantation region) are mixed together. Thus, a unilateral deterioration in the gate characteristics can be restrained.

<B-2. Characteristic Function and Effect>

In the method for manufacturing a thyristor according to the second embodiment of the present invention described above, the ion implantation region 11 is partially formed on the K plane side in the N⁻ silicon substrate 101 and the ion implantation region 11 is formed over the whole area on the A plane side so that the turn-off time can be shortened and the ON-state voltage can be controlled. Consequently, the trade-off relationship between the ON-state voltage and the turn-off time can be improved.

By varying the ratio of $\Phi_K$ to $\Phi_A$, the trade-off relationship between the ON-state voltage and the turn-off time can be changed to optional characteristics.

By limiting the ratio of $\Phi_K$ to $\Phi_A$ to the range of 10:1 to 1:1, it is possible to restrain the deterioration in the gate characteristics obtained during the ON control action (the relationship between the gate voltage $V_{GT}$ and the gate current $I_{GT}$).

<C. Third Embodiment>

A method for controlling a lifetime of a minority carrier according to a third embodiment of the present invention will be described below with reference to FIGS. 10 to 13.

<C-1. Specific Method for Controlling Lifetime of Minority Carrier>

While the method for partially forming the ion implantation region 11 on the K and A plane sides in the N⁻silicon substrate 101 respectively has been described in the first embodiment of the present invention with reference to FIGS. 1 to 7, an ion implantation region may be formed over a whole area on both plane sides. As the third embodiment according to the present invention, an example in which the ion implantation region is formed over the whole area on both plane sides will be described below.

<C-1-1. Form of Ion Implantation>

Figure 10:
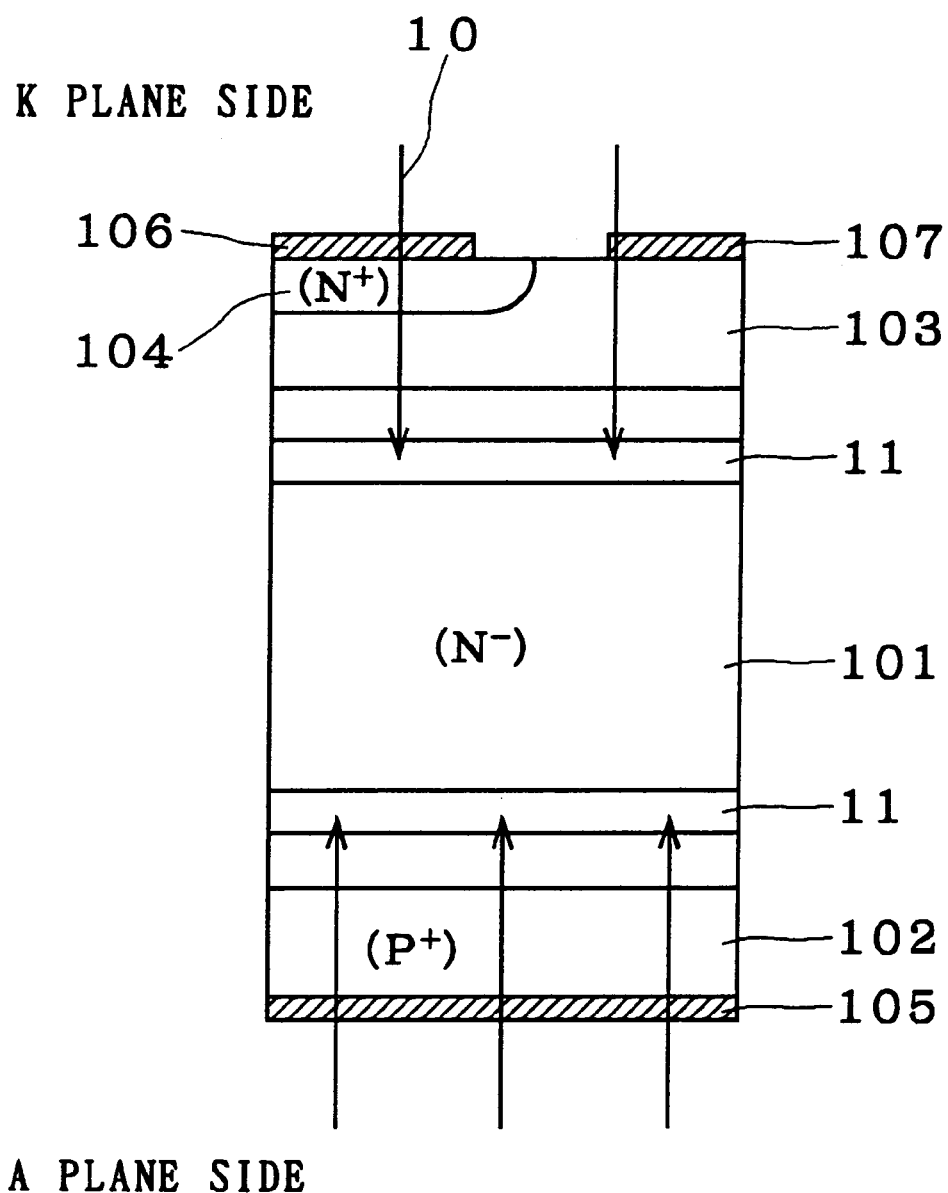
FIG. 10 is a view for explaining a third embodiment of the present invention.

The form of ion implantation will be described below with reference to FIG. 10 showing a portion similar to the region X enclosed by the broken line in FIG. 2. In FIG. 10, a shielding member is not provided in spaces above K and A planes.

When a heavy ion beam 10 having a high energy such as Ne is irradiated from the K and A plane sides onto a high withstand voltage thyristor 100 which has no shielding member provided in the spaces above the K and A planes, an ion implantation region 11 is formed over the whole area at a depth corresponding to an energy (accelerating energy).

Formation depths of the ion implantation region 11 are set such that the ion implantation region 11 is provided, on the K plane side, in an N⁻ silicon substrate 101 inside a junction face of a P diffusion layer 103 and the N⁻ silicon substrate 101, and is provided, on the A plane side, in the N⁻ silicon substrate 101 inside a junction face of a P⁺ diffusion layer 102 and the N⁻ silicon substrate 101.

<C-1-2. Function and Effect of Full Both-side Implantation>

The function and effect of forming the ion implantation region 11 over the whole area on the K and A plane sides in the N⁻ silicon substrate 101 will be described below.

As described above with reference to FIGS. 4 and 5, the following effects can be obtained by forming the ion implantation region 11 over the whole area on the K and A plane sides. Characteristics in the early stage of turn-off can be improved to reduce an ON-state voltage and a tail current can be reduced to shorten a turn-off time. By combining both effects, accordingly, the ON-state voltage can be reduced and the turn-off time can be shortened. Consequently, the trade-off relationship between the ON-state voltage and the turn-off time can be improved.

An amount of ions irradiated from the K plane side is represented by $\Phi_K$, an amount of ions irradiated from the A plane side is represented by $\Phi_A$ and a total amount of ions irradiated from both planes is represented by $\Phi_{tot}$. By varying the ratio of $\Phi_K$ to $\Phi_A$, the trade-off relationship between the ON-state voltage and the turn-off time can be changed to optional characteristics.

In the same manner as in the second embodiment according to the present invention which has been described above with reference to FIG. 9, it is possible to select the main improvement of the ON-state voltage or that of the turn-off time by varying the ratio of $\Phi_K$ to $\Phi_A$ within the range of 0.5:1 to 1:1.

<C-2. Reduction in Fluence of Total Irradiation Amount>

The present embodiment features that the trade-off relationship can be changed to optional characteristics within the range in which the ratio of $\Phi_K$ to $\Phi_A$ is 0.5:1 to 1:1. This leads to a reduction in the fluence of the heavy ion beam 10 having a high energy.

Figure 11:
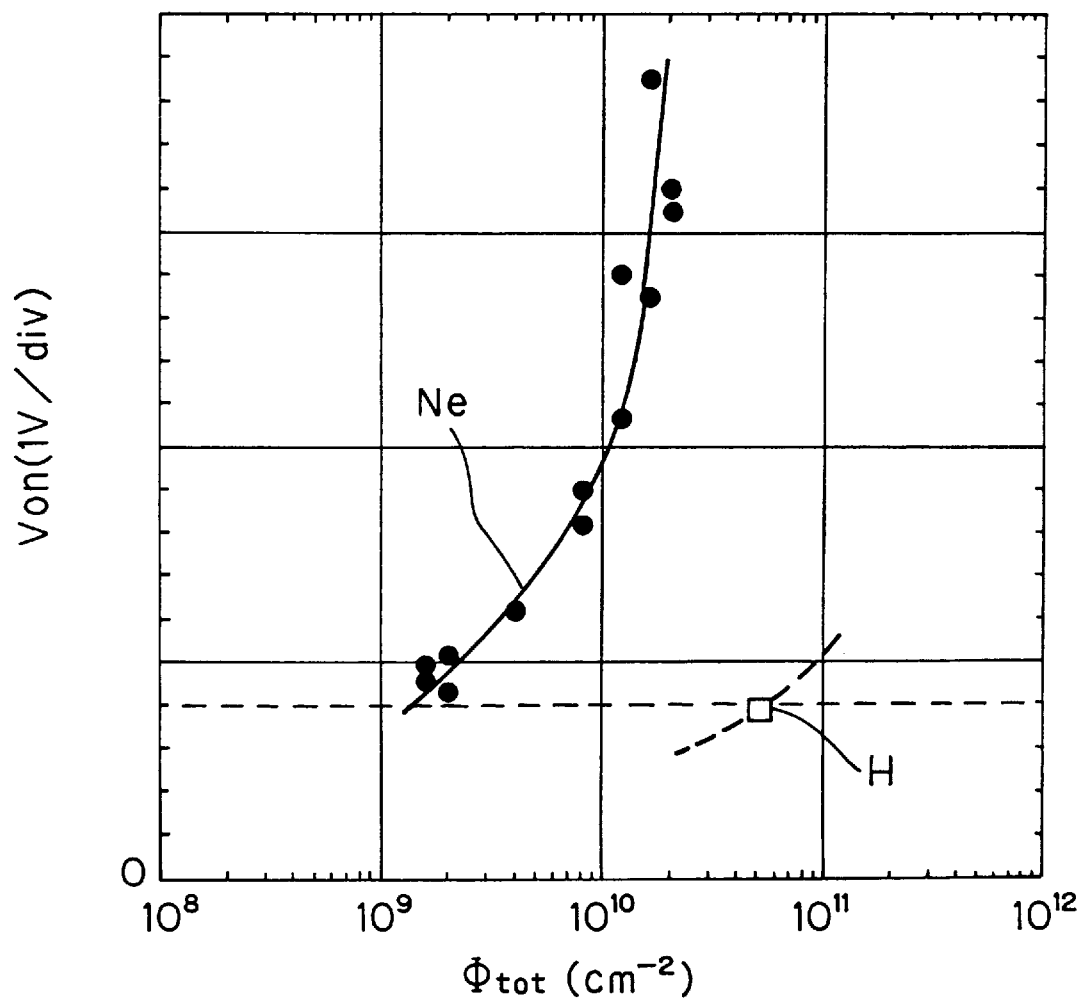
FIG. 11 is a chart showing the relationship between a total irradiation amount $\phi_{tot}$ and an ON-state voltage $V_{on}$ which is obtained when full both-side implantation is performed.

FIG. 11 shows the relationship between the total irradiation amount $\Phi_{tot}$ and an ON-state voltage $V_{on}$ obtained when full both-side irradiation is performed. In this case, an ion species is Ne, an accelerating energy is 260 MeV and an implantation depth is adjusted through an Al (aluminum) absorber having a thickness of 105 μm and the ratio of $\Phi_K$ to $\Phi_A$ is 1:1. For comparison is shown a result obtained by accelerating H (hydrogen) to 4.5 MeV and performing irradiation through an Al absorber having a thickness of 30 um.

FIG. 11 shows the relationship between the total irradiation amount $\Phi_{tot}$ and the ON-state voltage $V_{on}$, in which an axis of abscissa indicates the total irradiation amount $\Phi_{tot}$ and an axis of ordinate indicates the ON-state voltage $V_{on}$. The result of Ne implantation is shown by a black circle, and the result of H implantation is shown by a square.

As is apparent from FIG. 11, in the case where the Ne implantation is performed, a characteristic curve has the total irradiation amount $\Phi_{tot}$ which ranges from $2 \times 10^9/cm^2$ to $2 \times 10^{11}/cm^2$. The total irradiation amounts $\Phi_{tot}$ necessary for obtaining the same ON-state voltage $V_{on}$ are compared for the results of the Ne implantation and the H implantation. In case of the Ne implantation, the total irradiation amount $\Phi_{tot}$ is about $2 \times 10^9/cm^2$. In case of the H implantation, the total irradiation amount $\Phi_{tot}$ is about $6 \times 10^{10}/cm^2$. Consequently, the total irradiation amount $\Phi_{tot}$ for the Ne implantation is about 3% of that for the H implantation. The result of the H implantation has one data. However, if it is assumed that the result of the H implantation has the same characteristics as the result of the Ne implantation, a fluence can be reduced considerably by performing the Ne implantation.

The reason is that the density of crystal defects generated in the vicinity of a range position is greatly increased by using ions having a higher atomic number, that is, heavy ions. As one of effects obtained by a reduction in the fluence, a time required for ion implantation is shortened. More specifically, if a time required to reach a total irradiation amount necessary for obtaining a predetermined ON-state voltage by the H implantation is 1, a time required for the Ne implantation is 1/30 or less. Consequently, a time required to perform the ion implantation is greatly reduced, and furthermore the manufacturing cost of a thyristor can be lowered.

The reduction in the fluence of the total irradiation amount obtained by using the heavy ion beam having a high energy is not restricted to the present embodiment. The same effect can also be obtained in the method for manufacturing a thyristor according to the first and second embodiments.

<C-3. Improvement of Trade-off Relationship between On-state Voltage and Reverse Recovery Charge Amount>

By using the heavy ion beam having a high energy, the trade-off relationship between an ON-state voltage and a reverse recovery charge amount can be improved in addition to the reduction in the fluence of the total irradiation amount described above.

Figure 12:
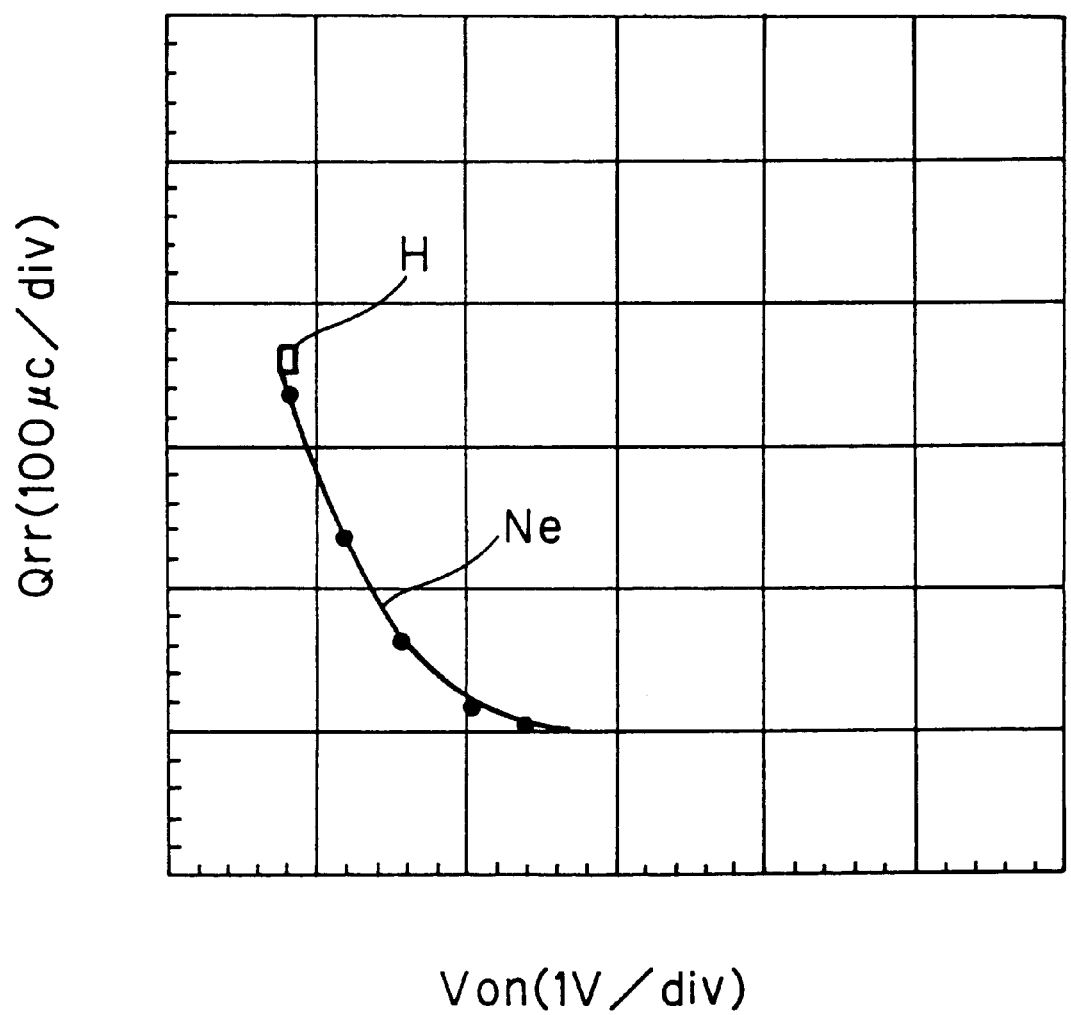
FIG. 12 is a chart showing the trade-off relationship between the ON-state voltage and a reverse recovery charge amount which is obtained when the full both-side implantation is performed.

FIG. 12 shows the relationship between an ON-state voltage $V_{on}$ and a reverse recovery charge amount $Q_{rr}$, in which an axis of abscissa indicates the ON-state voltage $V_{on}$ and an axis of ordinate indicates the reverse recovery charge amount $Q_{rr}$. In this case, an ion species is Ne, an accelerating energy is 260 MeV and an implantation depth is adjusted through an Al (aluminum) absorber having a thickness of 105 um. For comparison is shown a result obtained by accelerating H (hydrogen) to 4.5 MeV and performing irradiation through an Al absorber having a thickness of 30 um. The result of Ne implantation is shown by a black circle, and the result of H implantation is shown by a square.

The result of Ne implantation and that of H implantation are compared for the same ON-state voltage $V_{on}$. Consequently, it is apparent from FIG. 12 that the reverse recovery charge amount $Q_{rr}$ for the Ne implantation is reduced by 5 to 8% as compared with that for the H implantation. This means that the trade-off relationship between the ON-state voltage $V_{on}$ and the reverse recovery charge amount $Q_{rr}$ is improved by 5 to 8% by performing the Ne implantation.

The reason is that Ne atoms injected into the N⁻ silicon substrate 101 cause Si atoms to recoil for substitution. Since the size of the Ne atom approximates that of the Si atom, the surrounding Si is rarely affected and becomes present stably. As described above, moreover, the fluence of the total irradiation amount is reduced. Consequently, it is supposed that the number of the Ne atoms substituted for the Si atoms is smaller and the ratio of composite defects which purely function as recombination centers is increased.

As one of effects obtained by the improvement of the trade-off relationship between the ON-state voltage and the reverse recovery charge amount, a reverse recovery time of the thyristor can be shortened and switching operation can be performed at a higher speed, that is, the frequency of the thyristor can be increased.

<C-4. Various Condition of Implantation of Heavy Ion Beam having High Energy>

When implanting a heavy ion beam having a high energy according to the present embodiment and the first and second embodiments, various conditions to be described below should be met. Consequently, a high withstand voltage thyristor can be obtained in the optimum state.

Figure 13:
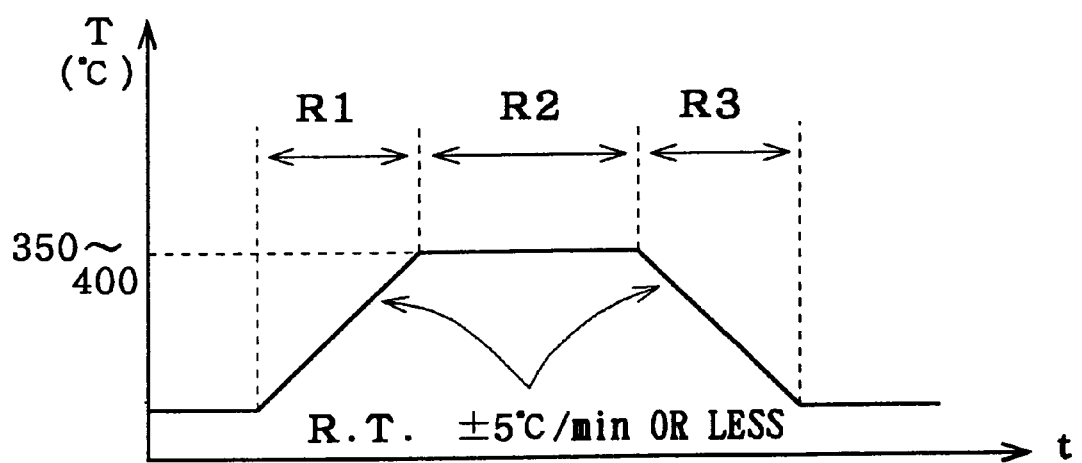
FIG. 13 is a chart showing a heat history sequence for implanting a heavy ion beam having a high energy.
Figure 14:
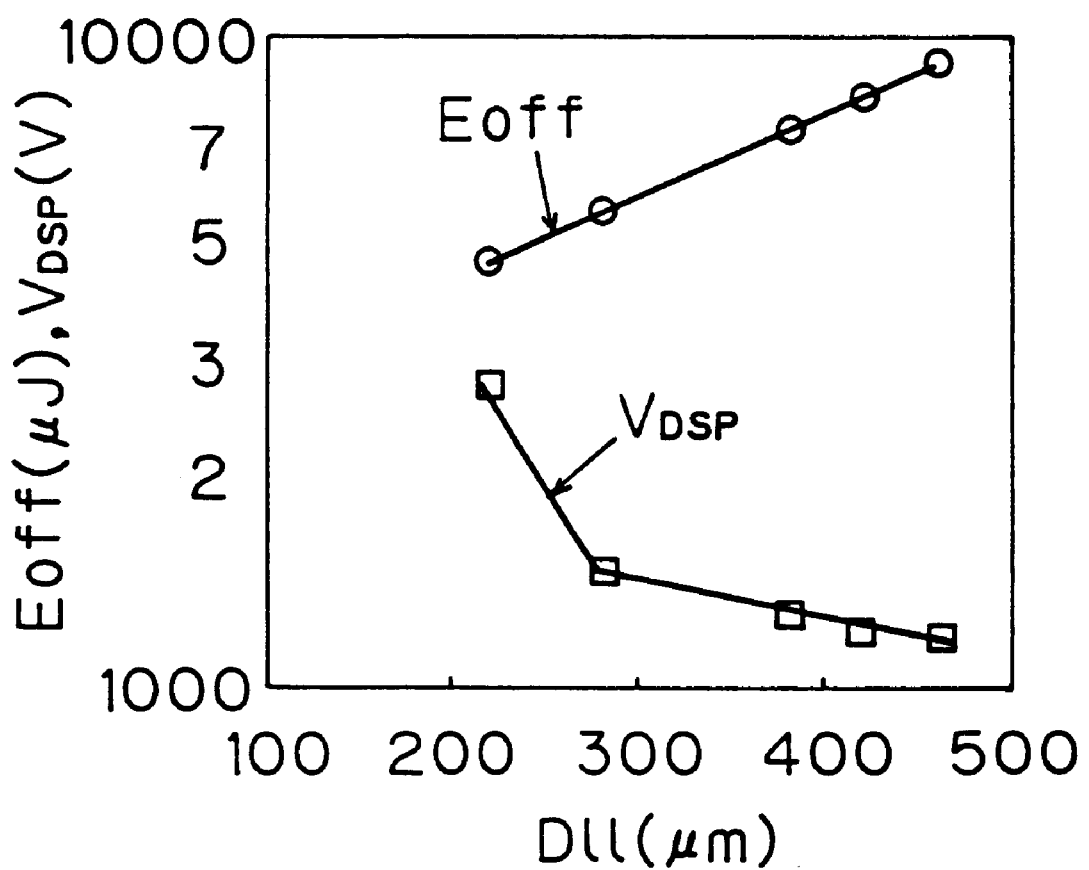
FIG. 14 is a chart showing the relationship among a range position $D_{ll}$, a spike voltage $V_{DSP}$ applied during turn-off and an energy loss $E_{off}$ which is obtained by a conventional method.
Figure 15:
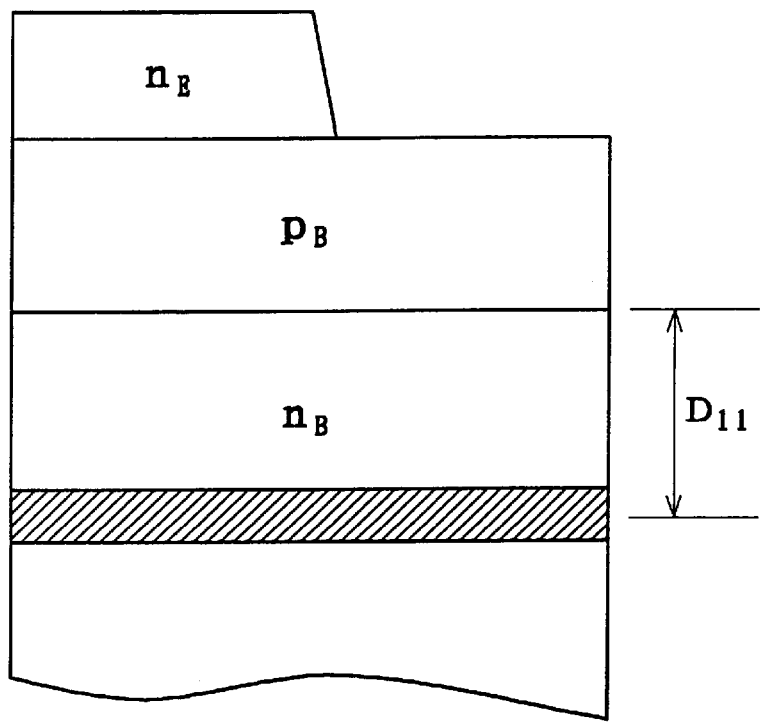
FIG. 15 is a view showing a partial structure of a GTO according to the prior art.
Figure 16:
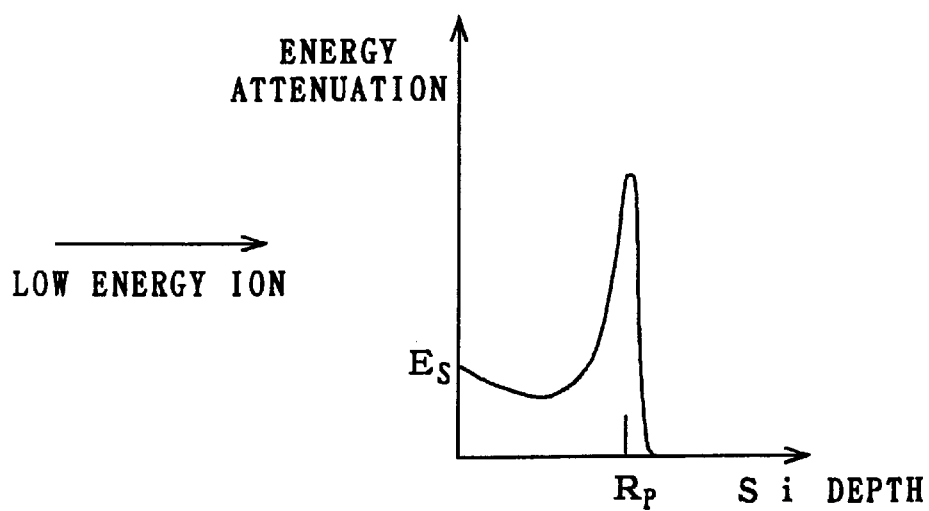
FIG. 16 is a chart for explaining a difference in an energy attenuation profile in a silicon which is caused by a difference in an accelerating energy.

FIG. 13 shows a heat history sequence for implanting the heavy ion beam having a high energy. In FIG. 13, an axis of abscissa indicates an elapsed time t and an axis of ordinate indicates a temperature T.

As shown in FIG. 13, the temperature of a high withstand voltage thyristor 100 set to a room temperature before implantation is first raised to 350 to 400° C. with a temperature gradient of 5° C./min or less (or a temperature change rate R.T.) in a period R1.

In a period R2, ion irradiation is then performed with the temperature kept at 350 to 400° C. on the condition that a maximum fluence ratio is $1 \times 10^9$ pc/cm²·sec or less, and is continued until the total irradiation amount reaches a predetermined value.

After the ion irradiation is completed, the temperature is caused to fall with a temperature gradient of 5° C./min or less (or a temperature change rate R. T.) so as to reach the room temperature in a period R3.

The reason why the above-mentioned process for the rise and fall in the temperature is performed is as follows. More specifically, a silicon substrate to be used for the high withstand voltage thyristor is manufactured by a FZ (FLOATING ZONE MELTING) method in order to attain a necessary high specific resistivity (for example, 500 Ω·cm or more). According to the same method, however, the concentration of impurities such as C (carbon) or O (oxygen) is reduced. Therefore, the silicon substrate has low mechanical strength and is easily broken when stress or the like is applied by thermal distortion. Accordingly, it is necessary to limit the temperature gradient at the time of the rise and fall in the temperature so as not to cause the thermal distortion. While it is desired that the temperature gradient has a smaller value, a practical value is determined in consideration of the manufacturing cost.

The ion irradiation is performed with the temperature of the high withstand voltage thyristor 100 kept at 350 to 400° C. in order to recover and cancel unstable crystal defects generated by the ion implantation by annealing simultaneously with generation and to leave comparatively stable composite defects to function as the recombination centers. Thus, unnecessary collapse of a crystal structure can be restrained and conductivity can be kept.

The fluence ratio is limited to $1 \times 10^9$ pc/cm² sec or less in order to prevent various crystal defects generated by an ion from being further disturbed by succeeding ions and growing into more macro crystal defects before they are recovered and canceled by the annealing, that is, a predetermined relaxation time passes. Thus, it is possible to prevent the structures of the crystal defects from differing due to a difference in the fluence ratio even if the total irradiation amounts are equal. In addition, it is possible to prevent electrical characteristics from differing due to a difference in the structure of the crystal defect. Consequently, the electrical characteristics of the manufactured thyristor can be made uniform.

While the invention has been described in detail, the foregoing description is in all aspects illustrative and not restrictive. It is understood that numerous other modifications and variations can be devised without departing from the scope of the invention.

What is claimed is:

1. A thyristor comprising:

a first semiconductor layer of a first conductivity type, a second semiconductor layer of a second conductivity type, and a third semiconductor layer of the first conductivity type sequentially provided;

a fourth semiconductor layer of the second conductivity type selectively provided in a surface of said third semiconductor layer;

a gate electrode provided in contact with only said third semiconductor layer, a first electrode provided in contact with said fourth semiconductor layer and said third semiconductor layer, and a second electrode provided in contact with only said first semiconductor layer;

a first ion implantation region including heavy ions formed at a first depth in said second semiconductor layer which is closer to an interface between the second semiconductor layer and said third semiconductor layer than to an interface between the second semiconductor layer and said first semiconductor layer; and a second ion implantation region including heavy ions formed at a second depth in said second semiconductor layer which is closer to an interface between the second semiconductor layer and said first semiconductor layer than to an interface between the second semiconductor layer and said third semiconductor layer;

said first and second ion implantation regions each extending throughout a whole respective plane at said first and second depths in said second semiconductor layer and at least one of said first and second ion implantation regions being formed as a group of a plurality of ion implantation areas which are discretely provided along with interspaced non-implantation areas on the whole respective plane to provide a controllable amount of shortening of a lifetime of a minority carrier based upon the relationship between the ion implantation areas and the interspaced non-implantation areas therebetween.

2. The thyristor according to claim 1, wherein said first and second ion implantation regions both have ion implantation areas which are discretely provided along with interspaced non-implantation areas on the whole respective plane.

3. The thyristor according to claim 1, wherein only said first ion implantation region has ion implantation areas which are discretely provided along with interspaced non-implantation areas on the whole respective plane.

4. The thyristor according to in claim 1, wherein said heavy ions are Ne, Ar, Kr, C, Si or Ge.

* * * * *